(12) United States Patent
Miles

(10) Patent No.: US 6,741,377 B2
(45) Date of Patent: May 25, 2004

(54) DEVICE HAVING A LIGHT-ABSORBING MASK AND A METHOD FOR FABRICATING SAME

(75) Inventor: Mark W. Miles, San Francisco, CA (US)

(73) Assignee: Iridigm Display Corporation, San Francisco, CA (US)

( * ) Notice: Subject to any disclaimer, the term of this patent is extended or adjusted under 35 U.S.C. 154(b) by 0 days.

(21) Appl. No.: 10/190,400

(22) Filed: Jul. 2, 2002

(65) Prior Publication Data

US 2004/0027636 A1 Feb. 12, 2004

(51) Int. Cl.[7] .............................. G02F 1/03; G02F 9/00; G02B 26/00; G02B 6/12; G03C 5/00
(52) U.S. Cl. .................. 359/243; 359/247; 359/254; 359/291; 359/587; 385/14; 430/5; 430/322; 430/323; 216/12
(58) Field of Search ................................ 359/243, 247, 359/254, 230, 290, 291, 292, 293, 586, 587, 589; 385/14, 18, 24, 50; 430/5, 311, 322, 323; 216/12, 41

(56) References Cited

U.S. PATENT DOCUMENTS

| | | | |
|---|---|---|---|
| 4,287,449 A | | 9/1981 | Takeda et al. |
| 5,164,858 A | * | 11/1992 | Aguilera, Jr. et al. ........ 359/587 |
| 5,326,426 A | * | 7/1994 | Tam et al. ..................... 216/12 |
| 5,474,865 A | * | 12/1995 | Vasudev ........................ 430/5 |
| 5,835,255 A | | 11/1998 | Miles |
| 6,288,824 B1 | * | 9/2001 | Kastalsky .................... 359/254 |
| 6,342,970 B1 | * | 1/2002 | Sperger et al. ............. 359/587 |
| 6,466,354 B1 | * | 10/2002 | Gudeman ................... 359/247 |

* cited by examiner

*Primary Examiner*—Loha Ben
(74) *Attorney, Agent, or Firm*—Blakely, Sokoloff, Taylor & Zafman LLP

(57) ABSTRACT

The invention provides a method for fabricating an optical device comprising at least one optical component formed on a transparent substrate. The method comprises determining an area of the substrate that is to be light-absorbing; and fabricating a light-absorbing mask on the determined area prior to fabricating the at least one optical component. The invention also provides an optical device comprising a substrate; and first and second optical components formed on the substrate, wherein the first optical component has two modes, each mode producing a different optical response to light incident thereupon, and wherein the second optical component absorbs light and is formed on the substrate before the first optical component is formed.

24 Claims, 11 Drawing Sheets

DEVICE HAVING A LIGHT-ABSORBING MASK AND A METHOD FOR FABRICATING SAME

FIELD OF THE INVENTION

This invention relates to optical devices. In particular it relates to microoptical electromechanical devices and to a method for fabricating same.

BACKGROUND

Today, a wide variety of optical devices such as Microelectromechanical Systems (MEMS) devices may be fabricated using micromachining and microelectronic fabrication techniques.

For example in some cases, MEMS devices may include optical components and are more specifically referred to as micro-optoelectromechanical systems or "MOEMS" devices. One example of such a MOEMS device is the Interferometric Modulator (IMOD) device described in U.S. Pat. No. 5,835,255. The IMOD devices of U.S. Pat. No. 5,835,255 may be fabricated in an array and used in a reflective display wherein each IMOD functions as a pixel to provide a desired optical response.

In order to improve the desired optical response, the contribution of reflected ambient light from certain inactive areas of the IMODS should be reduced. Thus, these inactive areas of the IMODS should be made to be light-absorbing, typifying a need to mask-off or make light-absorbing inactive areas in optical devices in general.

SUMMARY OF THE INVENTION

According to one aspect of the invention there is provided a method for fabricating a device comprising at least one optical component formed on a transparent substrate, the method comprising determining an area of the substrate that is to be light absorbing; and fabricating a light-absorbing mask on the determined area prior to fabricating at least one optical component.

According to a second aspect of the invention, there is provided a device comprising a substrate; and first and second optical components formed on the substrate, wherein the first optical component has two modes, each producing a different optical response to light incident thereupon, and wherein the second optical component absorbs the light and is formed on the substrate before the first optical component is formed.

According to a third aspect of the invention there is provided a method for fabricating a device, the method comprising forming a static optical component on a substrate, wherein the static optical component absorbs light; and forming a dynamic optical component adjacent to the static optical component, wherein the dynamic optical component comprises a driven and an undriven state each having a characteristic optical response to incident light.

According to a further aspect of the invention there is provided a device comprising a substrate; a static optical component on the substrate, wherein the static optical component absorbs the light; and a dynamic optical component adjacent to the static optical component, wherein the dynamic optical component comprises a driven and an undriven state each having a characteristic optical response to incident light.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The present invention discloses, in one embodiment, a MEMS device in the form of a MOEMS device comprising a static optical component and a dynamic optical component, wherein the static optical component acts as "black mask" to absorb ambient or stray light thereby to improve the optical response of the dynamic optical component.

Although a MEMS device which includes an IMOD will be used to describe the present invention, it is to be understood that the invention covers other optical devices such as various imaging display and optoelectronic devices in general, which have inactive areas which are required to be light-absorbing, but which do not include IMODS.

Figure 1:
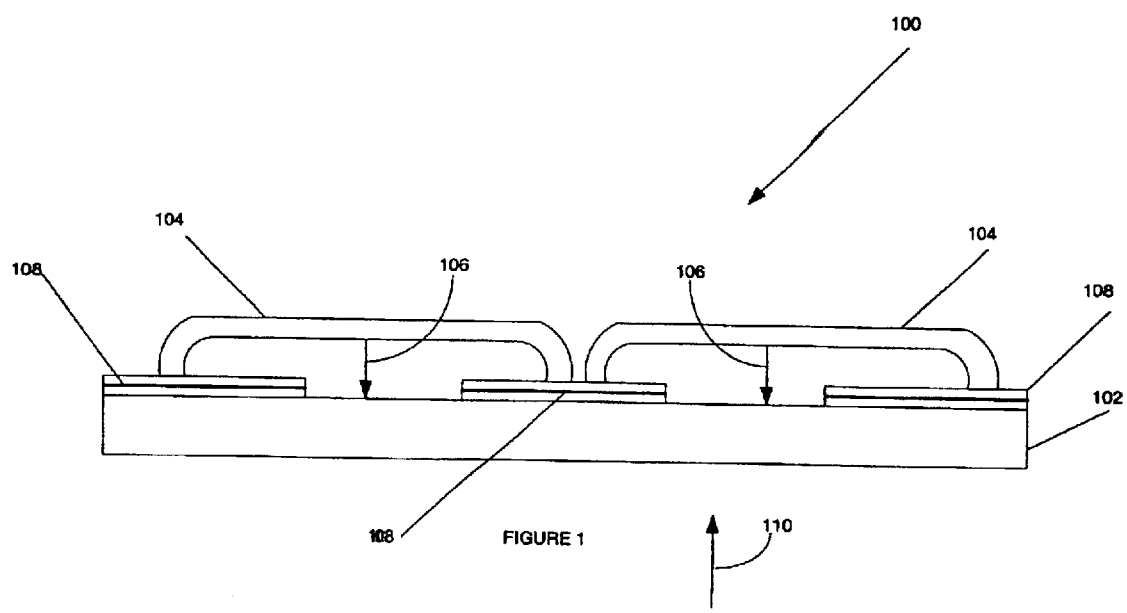
FIG. 1 of the drawings shows an end view of a display having inactive areas which have been masked-off in accordance with the present invention.

Referring now to FIG. 1 of the drawings, an end view of display device 100 is shown. It is to be understood that many components of the display 100 have been omitted so as not to obscure the present invention. The display device 100 includes two active optical components in the form of IMOD devices 104 which typically comprise an arrangement of reflective films which when driven towards a substrate 102 in a direction indicated by arrows 106 produces a desired optical response. The operation of the IMOD devices 104 has been described in U.S. Pat. No. 5,835,255 which is hereby incorporated by reference. Reference numerals 108 indicate inactive areas of the IMOD devices 104 which are required to be light-absorbing or to function as a "black mask" so that when a viewer looks at the display 100 from a direction indicated by arrow 110, the actual optical response produced by the IMOD devices 104 is not degraded by the reflection of ambient light from the inactive areas 108.

Each inactive area 108 may be fabricated from materials selected to have an optical response which absorbs or attenuates light. According to embodiments of the invention, each inactive area 108 may be fabricated as a stack of thin films. For example, in one embodiment, the stack of thin films may comprise a non-light-absorbing dielectric layer sandwiched between two light reflecting chrome layers, as will be more fully described below. In other embodiments, the inactive areas 108 may comprise a single layer of organic or inorganic materials which attenuates or absorbs light.

Figure 2:
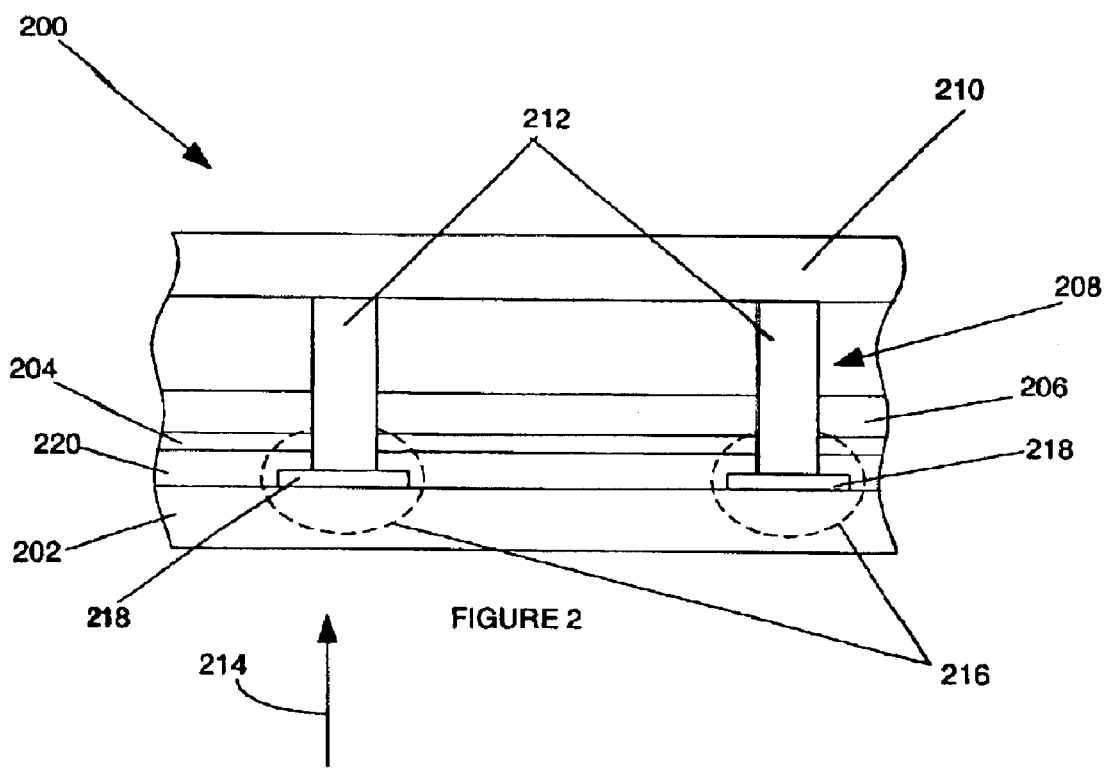
FIG. 2 of the drawings shows a cross-section through a MEMS device having a black mask or light-absorbing region in accordance with one embodiment of the invention.

FIG. 2 of the drawings shows a cross section through an IMOD device 200 in accordance with one embodiment of the invention. The IMOD device 200 includes an active component comprising a chrome reflective layer 204, a silicon oxide layer 206, an air gap 208, and a mechanical membrane 210 fabricated on a substrate 202. The mechanical membrane 210 is supported by polymer posts 212. In use, mechanical membrane 210 is driven to contact silicon oxide layer 206 to produce a desired optical response when viewed from the direction indicated by arrow 214.

Areas of each IMOD 200 on which the polymer posts 212 are formed are not part of the active component of the IMOD and therefore need to be light-absorbing in order to reduce stray or ambient light interfering with the desired optical response of the active IMOD components. These inactive areas define static components which are indicated by encircled areas 216, and are fabricated to form a stack of films selected so that the stack has the optical property that it is light-absorbing. In one embodiment, the invention involves determining which areas of substrate 202 needs to be light-absorbing and fabricating a light-absorbing or black mask on the determined areas prior to forming the active optical components of the IMODS. The black mask may include a stack of thin films which in one embodiment may comprise a chrome base 218, an oxide middle layer 220 and the chrome layers 204.

Figure 3:
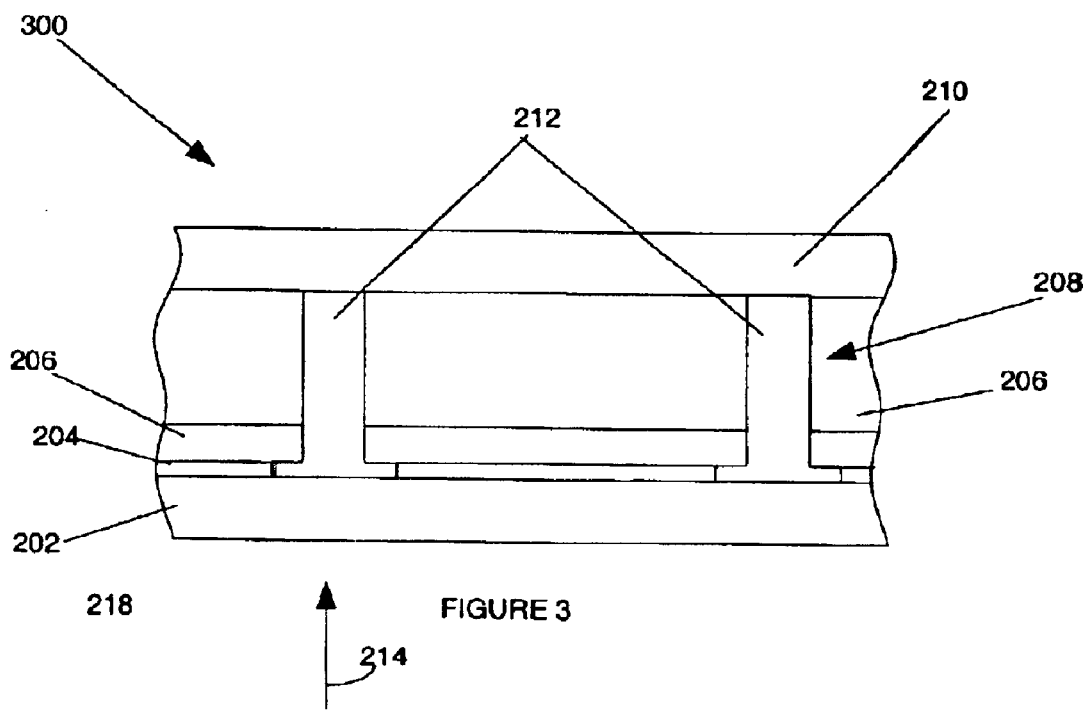
FIG. 3 shows another embodiment of a MEMS device having a black mask or light-absorbing region in accordance with another embodiment of the invention.

Referring now to FIG. 3 of the drawings, reference numeral 300 generally indicates another embodiment of an IMOD device in accordance with one aspect of the invention. IMOD device 300 is similar to the IMOD device 200 and accordingly like or similar reference numerals have been used to indicate like or similar components. The main difference between the IMOD 300 and the IMOD 200 is that the entire polymer post 212 comprises of an organic material e.g., a photo-definable black resin such as the material known as DARC 100 by Brewer Science Inc., that functions effectively as a light-absorbing or black mask. One advantage of the IMOD 300 is that the posts 212 perform two functions. Firstly, the posts 212 function as a mechanical support for mechanical membrane 210. Secondly the posts 212 function as an optical mask to mask off or make light-absorbing inactive areas of the IMOD.

Figure 4:
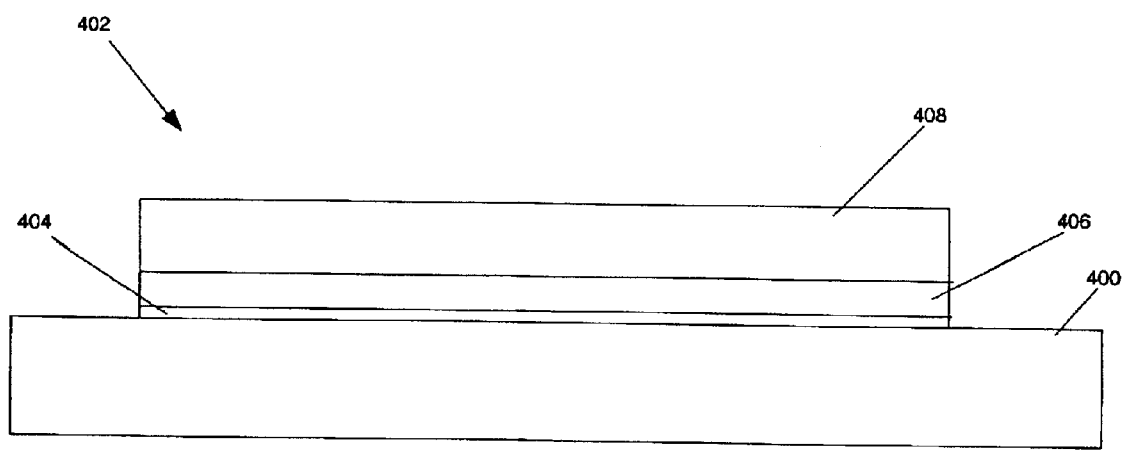
FIG. 4 shows the various layers making up the light-absorbing or black mask layers of the MEMS device FIG. 2.

FIG. 4 shows a schematic drawing wherein various layers making up thin film black mask in accordance with one embodiment of the invention is shown.

Referring to FIG. 4, a thin film black mask 402 shown fabricated on substrate 400. The black mask 402 comprises three layers of film which includes a chrome layer 404, a silicon oxide layer 406 and an aluminum layer 408. Various materials may be selected to produce the black mask. In one embodiment, the films which make up the black mask are the same films which are used in the fabrication of the active IMOD components, thus making it possible to use the same deposition parameters to fabricate the inactive and the active components.

The various stages in the manufacture of the thin film black mask 402 will now be described with reference to FIGS. 5A–5G of the drawings.

Figure 5A:
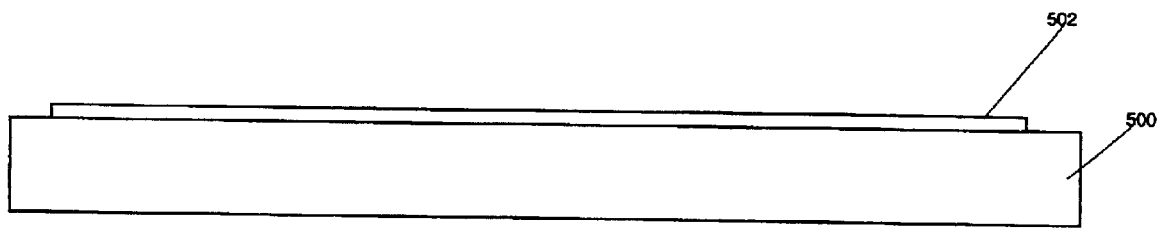
FIGS. 5A to 5G show various steps in the fabrication of a MEMS device in accordance with the invention.

Referring to FIG. 5A, after an initial preparatory step wherein a glass substrate 500 is prepared, e.g. cleaned, a reflective chrome layer 502 is deposited, e.g. by sputter coating it onto substrate 500. In one embodiment, the thickness of chrome layer 502 may be about 60 angstroms.

Figure 5B:
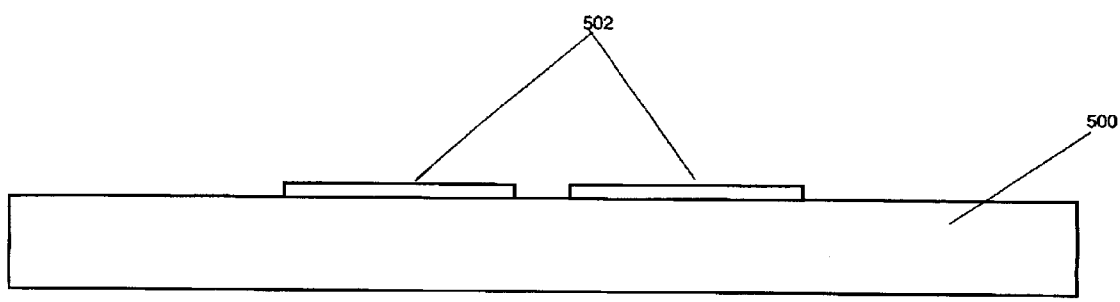

Thereafter, the chrome layer 502 is patterned and developed using conventional techniques to leave outcrops of chrome which will serve as a base layer for a thin film stack which serves as a black mask (see FIG. 5B).

A black mask oxide layer, e.g. $SiO_2$, typically about 300 to 800 angstroms is then deposited by sputter coating. The thickness of the black mask oxide layer depends on the quality of the black state that is required.

Next, a further reflective chrome layer 506 is sputter-coated on the black mask oxide layer 504. The layer 506 is typically about 60 angstroms thick, its exact thickness being dependent on the required brightness of the ultimate display, a thinner layer yielding a brighter display.

Figure 5C:
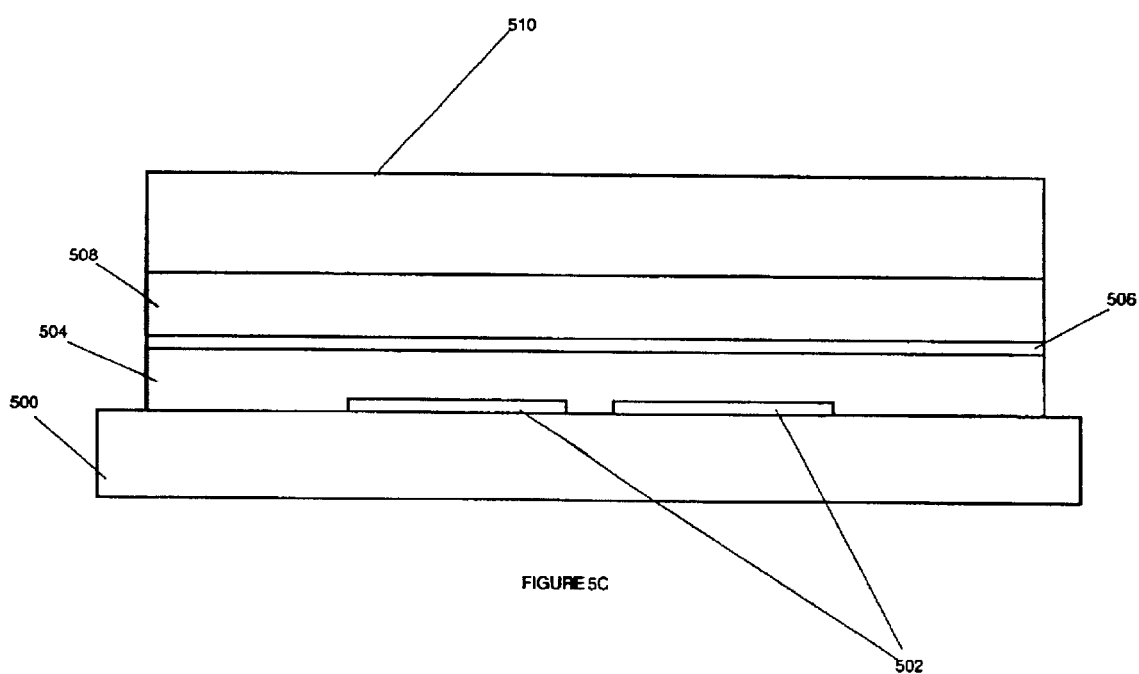

Thereafter, layers 508 and 510 are respectively sputter coated on layer 506. Layer 508 comprises silicon oxide and is about 300 to 800 angstroms whereas the layer 510 is a sacrificial layer comprising molybdenum and will typically be about 0.2 to 1.2 microns thick. Thus, layers 504 to 510 define a thick film stack on substrate 500 as can be seen in FIG. 5C.

Figure 5D:
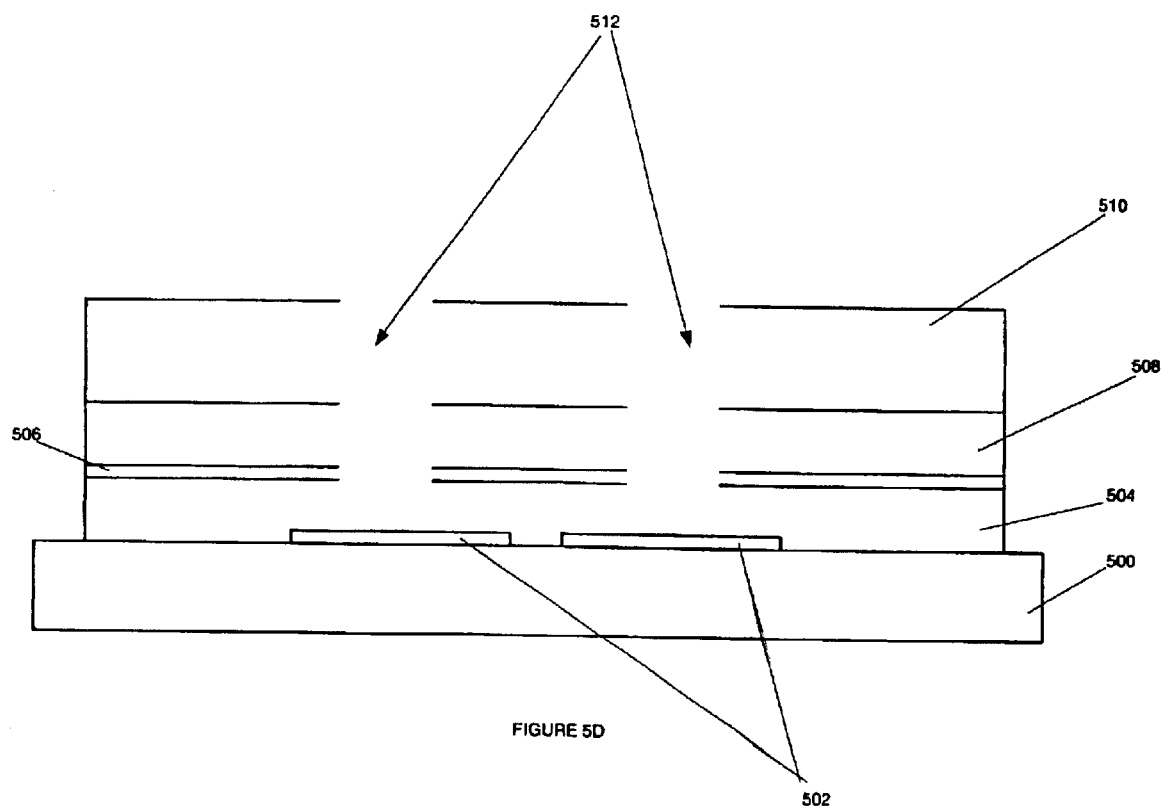

Referring to FIG. 5D, a patterning and an etching step is performed to form recesses 512 which extend through the thin film stack to chrome outcrops 502.

Figure 5E:
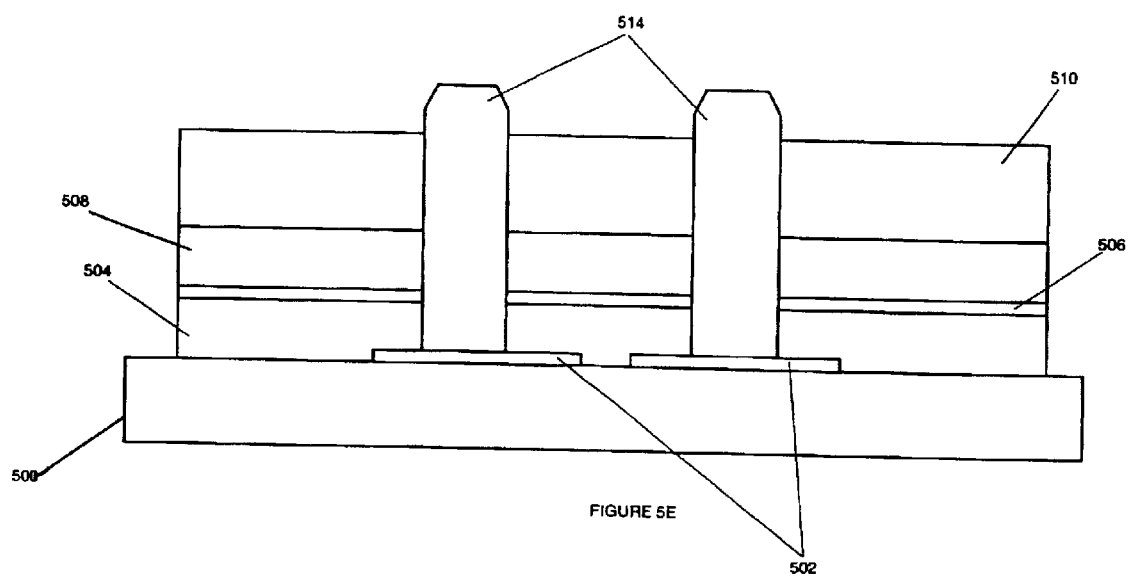

Referring to FIG. 5E, polymer posts 514 are formed in recesses 512 by spinning a negative photoresist material, e.g. the material known as NR7-350P by Futurex Inc., over the thin film stack; exposing it through a suitable mask and developing to form posts 514. These steps are conventional and therefore have not been further described.

Figure 5F:
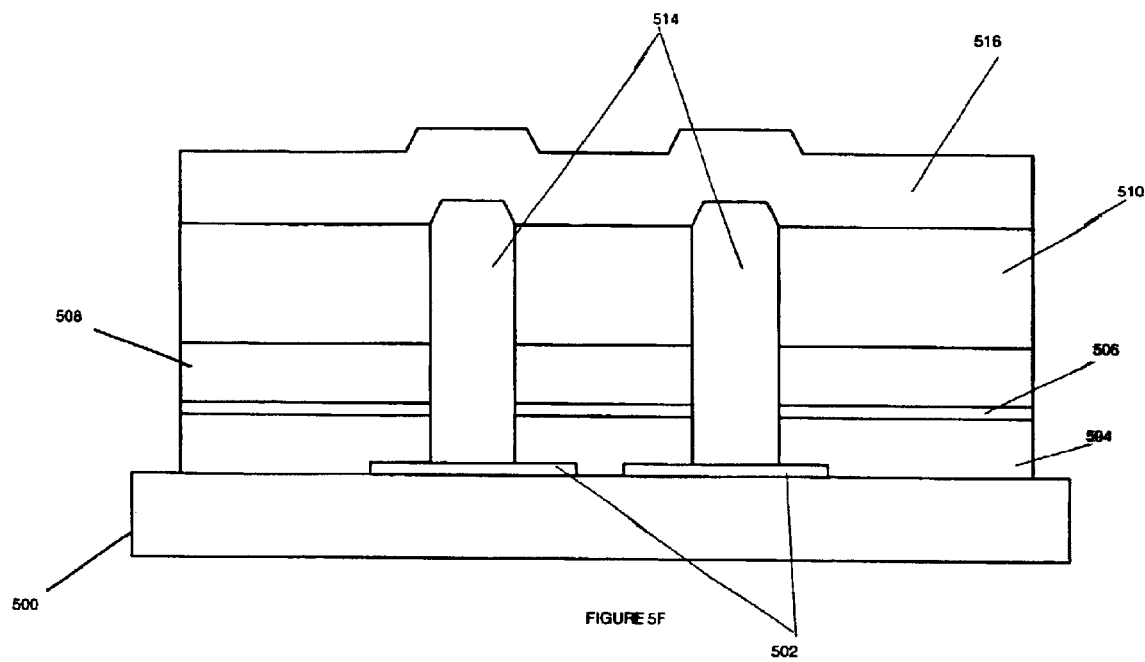

Referring now to FIG. 5F, a mechanical membrane 516 comprising an aluminum alloy, in one embodiment, is deposited by sputter coating it onto the molybdenum layer 510.

Figure 5G:
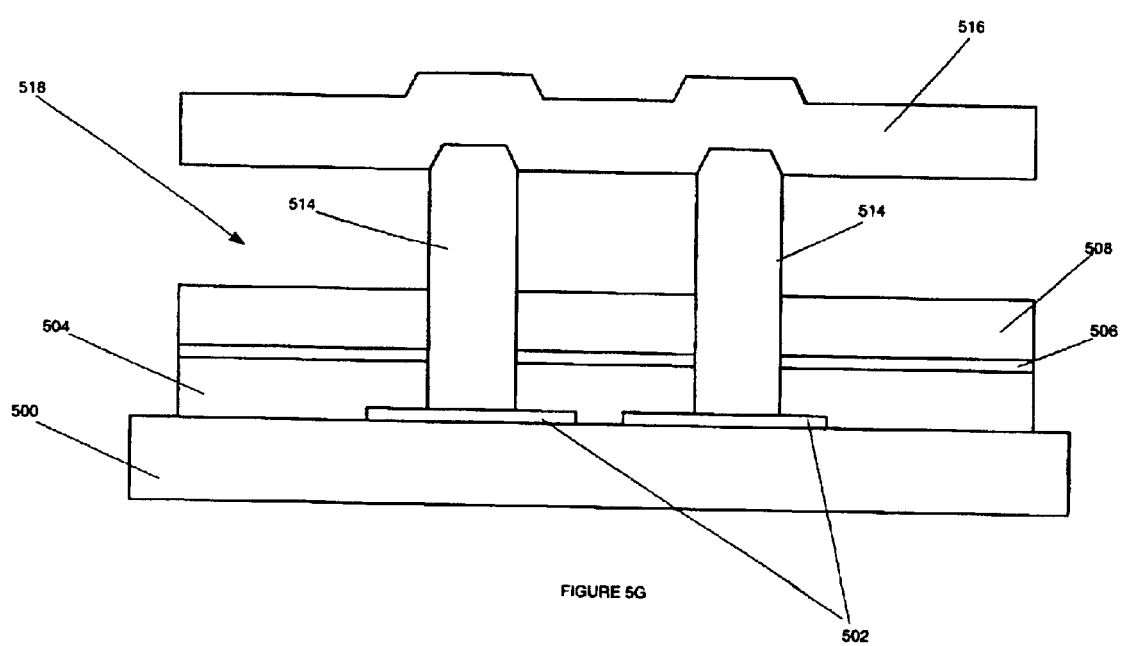

Thereafter, the molybdenum layer 510 is etched leaving an air gap 518 as shown in FIG. 5G of the drawings.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method for fabricating an optical device comprising at least one active optical component formed on a transparent substrate, the method comprising:

determining an area of the substrate that is to be light-absorbing wherein the determined area is laterally offset from the at least one active optical component; and fabricating a light-absorbing mask on the determined area prior to fabricating the at least one active optical component.

2. The method of claim 1, wherein the active optical component comprises a pixel, the light-absorbing area being an area bordering the pixel.

3. The method of claim 2, wherein the fabricating comprises depositing a first light-reflecting layer on the substrate, depositing a non-light-absorbing dielectric layer on the first light-reflecting layer; and depositing a second light-reflecting layer on non-light absorbing dielectric layer.

4. The method of claim 3, wherein the first and second light-reflecting layers comprise metallic materials are metallic.

5. The method of claim 4, wherein the non-light absorbing dielectric layer comprises an oxide layer.

6. The method of claim 2, wherein the pixel is defined by an interferometric modulator.

7. The method of claim 1, wherein the light-absorbing mask comprises an organic material.

8. The method of claim 7, wherein the organic material comprises a photo- definable black resin.

9. An optical device comprising:

a substrate; and first and second optical components formed on the substrate, wherein the first optical component has two modes, each mode producing a different optical response to light incident thereupon, and wherein the second optical component absorbs light, is laterally offset from the first optical component and is formed on the substrate before the first optical component is formed.

10. The device of claim 9, wherein the first optical component comprises an interferometric modulator.

11. The device of claim 10, wherein the second optical component is formed around the interferometric modulator.

12. The device of claim 9, wherein the second optical component comprises an organic material.

13. The device of claim 9, wherein the second optical component comprises a film stack.

14. The device of claim 13, wherein the film stack comprises a non-light-absorbing dielectric material sandwiched between two layers of chrome.

15. A method for microfabricating an optical device, the method comprising:

forming a static optical component on a substrate, wherein the static optical component absorbs light; and forming a dynamic optical component adjacent to the static optical component, wherein the dynamic optical component includes a driven and an undriven state, each state having a characteristic optical response to incident light, and wherein the dynamic optical component is laterally offset from the static optical component.

16. The method of claim 15, wherein the dynamic optical component comprises an interferometric modulator.

17. The method of claim 15, wherein the static optical component comprises a film stack.

18. The method of claim 17, wherein the film stack comprises a non-light-absorbing dielectric material sandwiched between two light-reflecting materials.

19. The method of claim 15, wherein the static optical component forms a mechanical support for portions of the dynamic optical component.

20. An optical device comprising:

a substrate;

a static optical component on the substrate, wherein the static optical component absorbs light; and a dynamic optical component adjacent to the static optical component, wherein the dynamic optical component includes a driven and an undriven state, each state having a characteristic optical response to incident light, and wherein the dynamic optical component is laterally offset from the static optical component.

21. The device of claim 20, wherein the dynamic optical component comprises an interferometric modulator.

22. The device of claim 20, wherein the state optical component comprises a film stack.

23. The device of claim 22, wherein the film stack comprises a non-light absorbing dielectric material sandwiched between two light reflecting materials.

24. The device of claim 20, wherein the static optical component forms a mechanical support for portions of the dynamic optical component.

* * * * *